US010950302B1

(12) United States Patent
Wu (10) Patent No.: US 10,950,302 B1
(45) Date of Patent: Mar. 16, 2021

(54) RESISTIVE MEMORY DEVICE

(71) Applicant: Winbond Electronics Corp., Taichung (TW)

(72) Inventor: Chang-Hsuan Wu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/877,511

(22) Filed: May 19, 2020

(51) Int. Cl.
*G11C 11/00* (2006.01)
*G11C 13/00* (2006.01)
*H01L 45/00* (2006.01)
*H01L 27/24* (2006.01)

(52) U.S. Cl.
CPC ...... *G11C 13/0026* (2013.01); *G11C 13/0028* (2013.01); *H01L 27/2463* (2013.01); *H01L 45/1253* (2013.01)

(58) Field of Classification Search
CPC . G11C 11/00; G11C 13/0026; G11C 13/0028; H01L 45/125
USPC ........................................................ 365/148
See application file for complete search history.

(56) References Cited

U.S. PATENT DOCUMENTS

| 7,638,878 | B2 | 12/2009 | Aritome | |
|---|---|---|---|---|
| 9,087,572 | B2 | 7/2015 | Sekar et al. | |
| 2012/0091587 | A1* | 4/2012 | Or-Bach | H01L 23/49827 257/741 |
| 2013/0249017 | A1* | 9/2013 | Kwon | H01L 29/8611 257/379 |
| 2013/0267046 | A1* | 10/2013 | Or-Bach | H01L 27/11526 438/14 |
| 2014/0321190 | A1* | 10/2014 | Shepard | H01L 27/112 365/94 |
| 2017/0317143 | A1* | 11/2017 | Chen | H01L 45/146 |
| 2018/0374901 | A1* | 12/2018 | Chen | H01L 45/1233 |

* cited by examiner

*Primary Examiner* — Harry W Byrne
(74) *Attorney, Agent, or Firm* — JCIPRNET (57) ABSTRACT

A resistive memory device including a substrate, an isolation structure, a word line, a source line, a bit line and a resistive memory is provided. The substrate includes a body region, and first, second and third doped regions, the first and second doped regions are spaced apart from each other by the body region. The isolation structure is disposed in the substrate, and the second doped region and the third doped region are spaced apart from each other by the isolation structure. The word line is disposed on the substrate, the first and second doped regions are located at opposite sides of the word line, and the first and third doped regions are located at the opposite sides of the word line. The source line is disposed on the substrate and electrically connected with the first doped region. The bit line and the resistive memory are disposed on the substrate, and the third doped region is electrically connected with the bit line via the resistive memory.

16 Claims, 8 Drawing Sheets

RESISTIVE MEMORY DEVICE

BACKGROUND

Technical Field

The present invention relates to a memory device, and more particularly, to a resistive memory device.

Description of Related Art

In order to achieve high memory capacity under the same area, a structure in which a single transistor is connected with multiple memories at the same time (i.e., 1TnR structure, n is an integer greater than 1) is currently developed. For such a high-density resistive random access memory, an issue of sneak current leakage occurs, thus causing adjacent memories to affect each other during operation, resulting in reduced reliability.

SUMMARY

The present invention provides a resistive memory device, which can avoid an issue of sneak current leakage with the structure of a single transistor connected with multiple memories at the same time (i.e., 1TnR structure, n is an integer greater than 1).

The resistive memory device of the present invention includes a substrate, an isolation structure, a word line, a source line, a first bit line and a first resistive memory. The substrate includes a body region, a first doped region, a second doped region and a third doped region, wherein the first doped region and the second doped region are spaced apart from each other by the body region. The isolation structure is disposed in the substrate, wherein the second doped region and the third doped region are spaced apart from each other by the isolation structure. The word line is disposed on the substrate, wherein the first doped region and the second doped region are located at opposite sides of the word line, and the first doped region and the third doped region are located at the opposite sides of the word line. The source line is disposed on the substrate and is electrically connected with the first doped region. The first bit line is disposed on the substrate. The first resistive memory is disposed on the substrate, wherein in the thickness direction of the substrate, the first resistive memory is located between the substrate and the first bit line, and the third doped region is electrically connected with the first bit line via the first resistive memory.

Based on the above, in the resistive memory device of the present invention, the first doped region and the second doped region at the opposite sides of the word line in the substrate are spaced apart from each other by the body region of the substrate, the second doped region and the third doped region in the substrate are spaced apart from each other by the isolation structure, the source line is electrically connected with the first doped region, and the third doped region is electrically connected with the bit line via the resistive memory, thereby during the operation of the resistive memory device, the isolation structure provided between the second doped region and the third doped region can be used as a switch to control the transmission path between the resistive memory and the transistor to be turned on or turned off. In this way, during the operation of the resistive memory device, the transmission path of the sneak current leakage is cut off, whereby the current of the selected resistive memory can be accurately read to judge the status thereof.

In order to make the aforementioned features and advantages of the disclosure more comprehensible, embodiments accompanied with figures are described in detail below.

DESCRIPTION OF THE EMBODIMENTS

Figure 1:
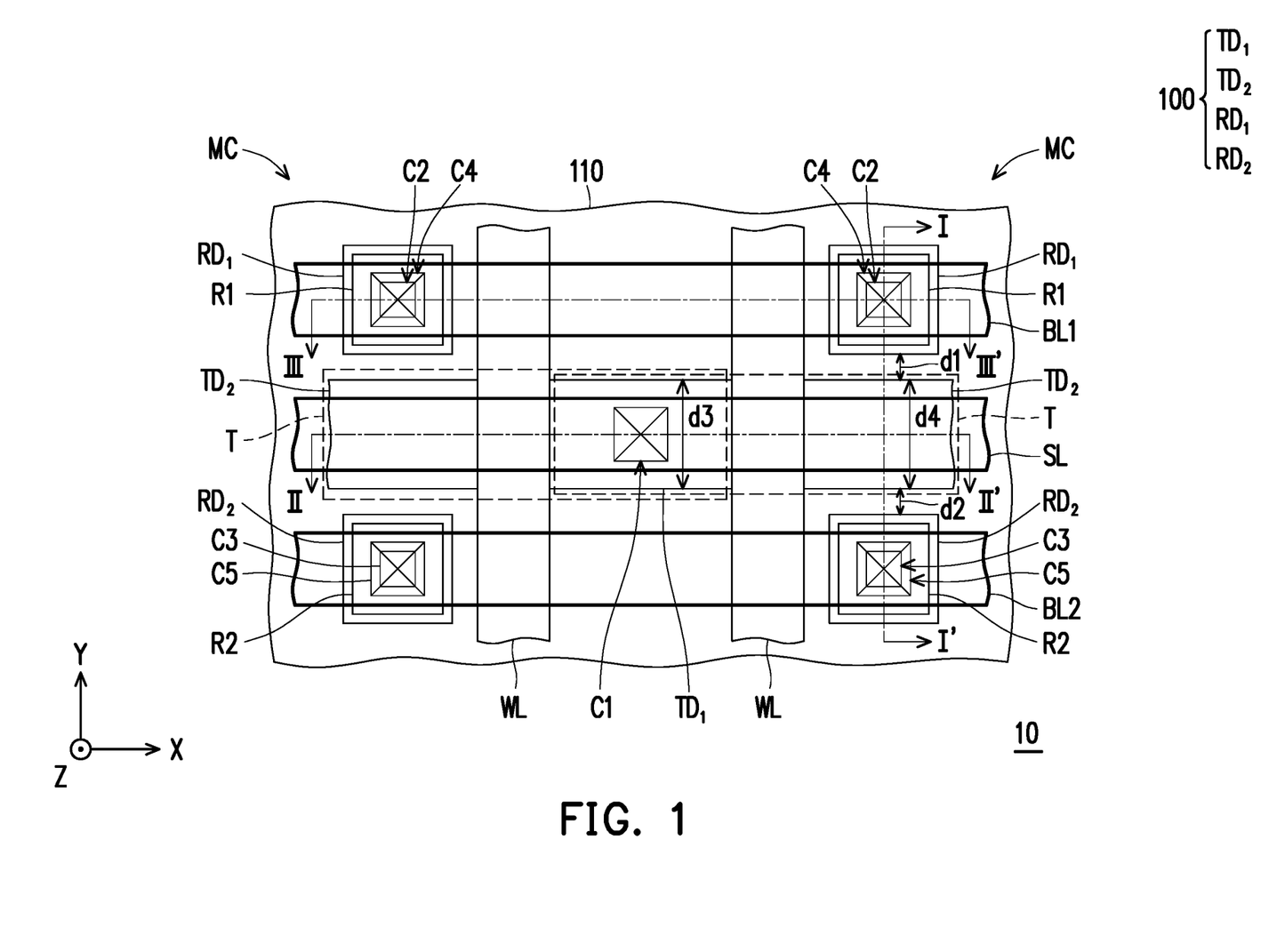
FIG. 1 is a schematic top view of a resistive memory device according to an embodiment of the invention.
Figure 2:
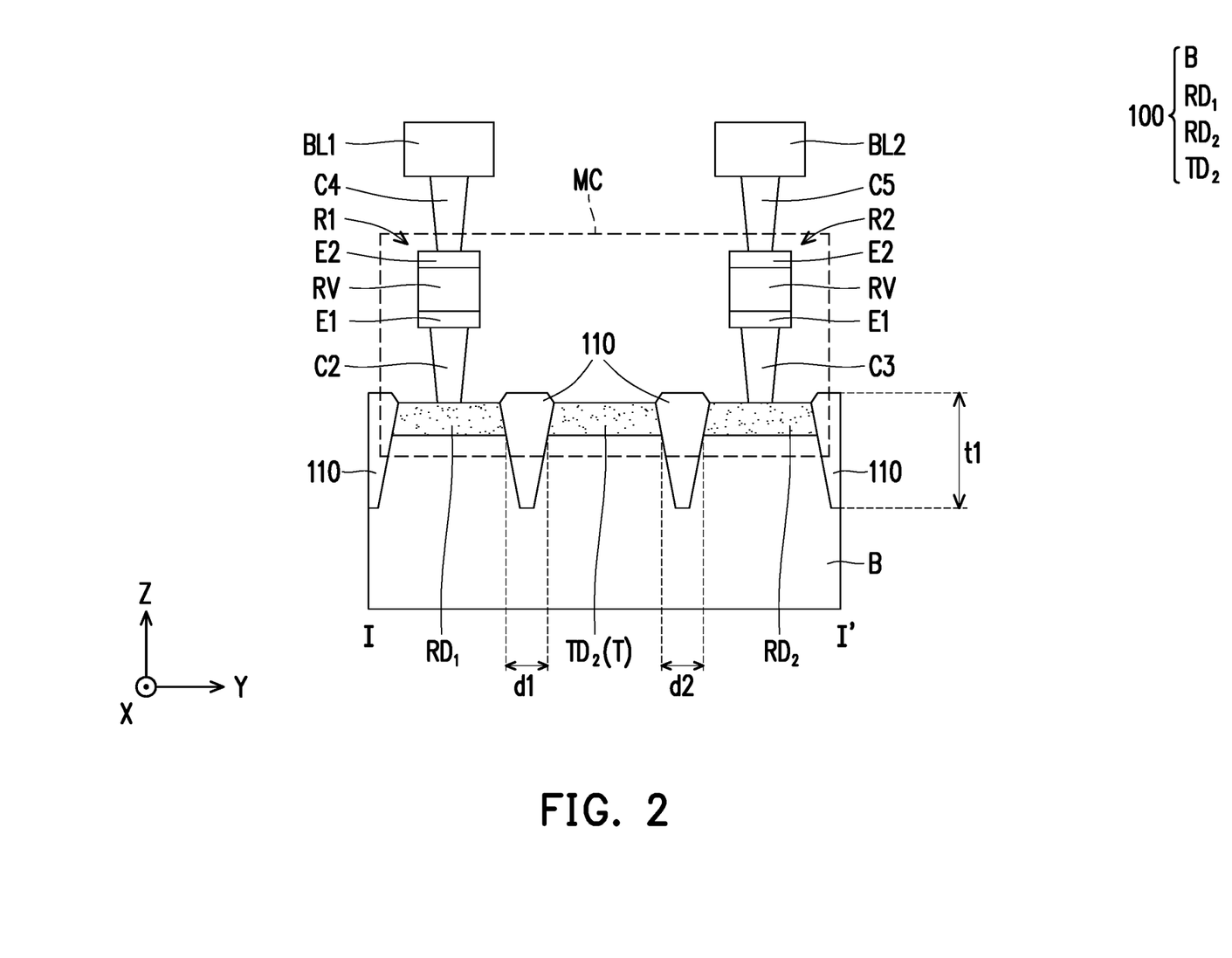
FIG. 2 is a schematic cross-sectional view taken along line I-I' of FIG. 1.
Figure 3:
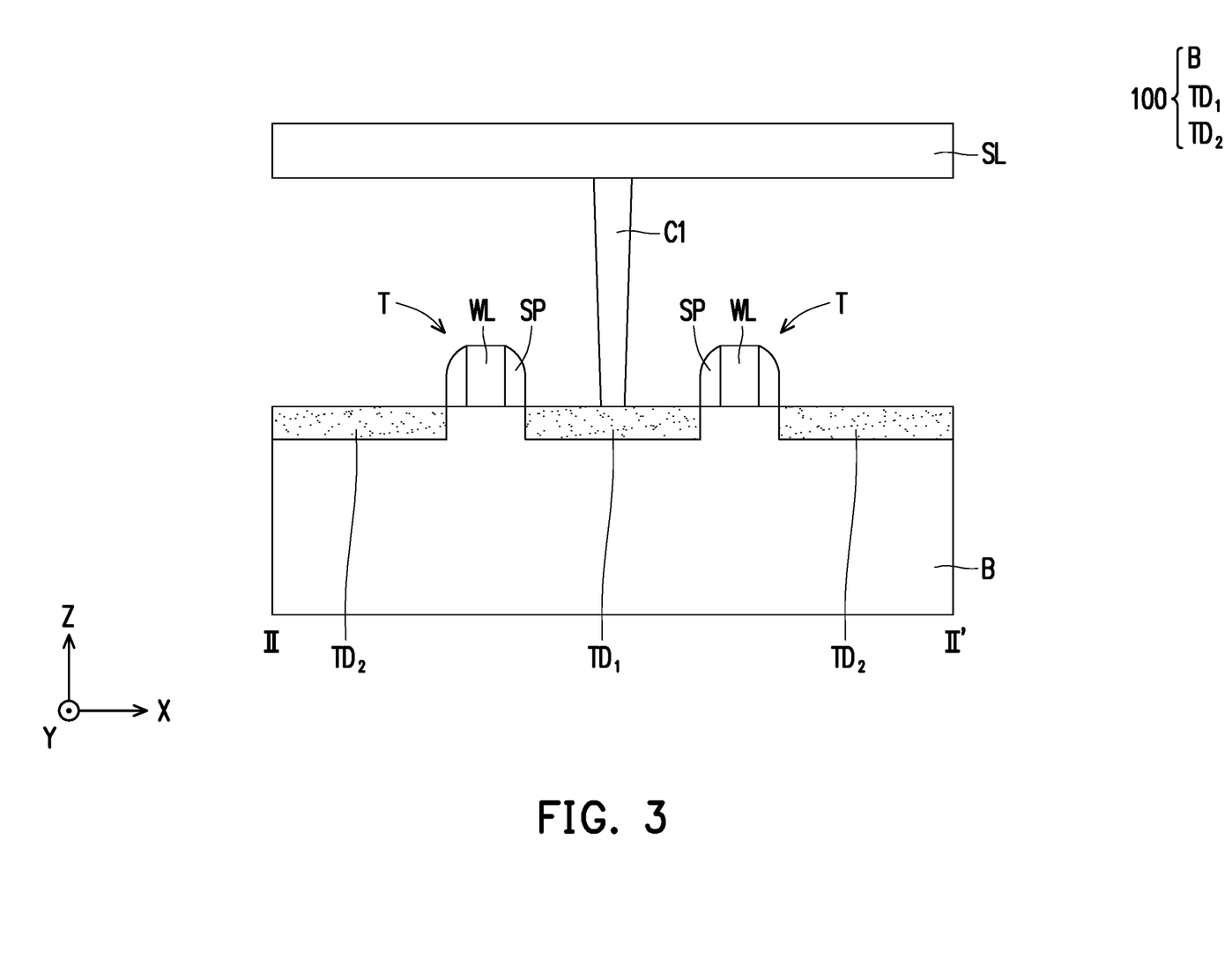
FIG. 3 is a schematic cross-sectional view taken along line II-II' of FIG. 1.
Figure 4:
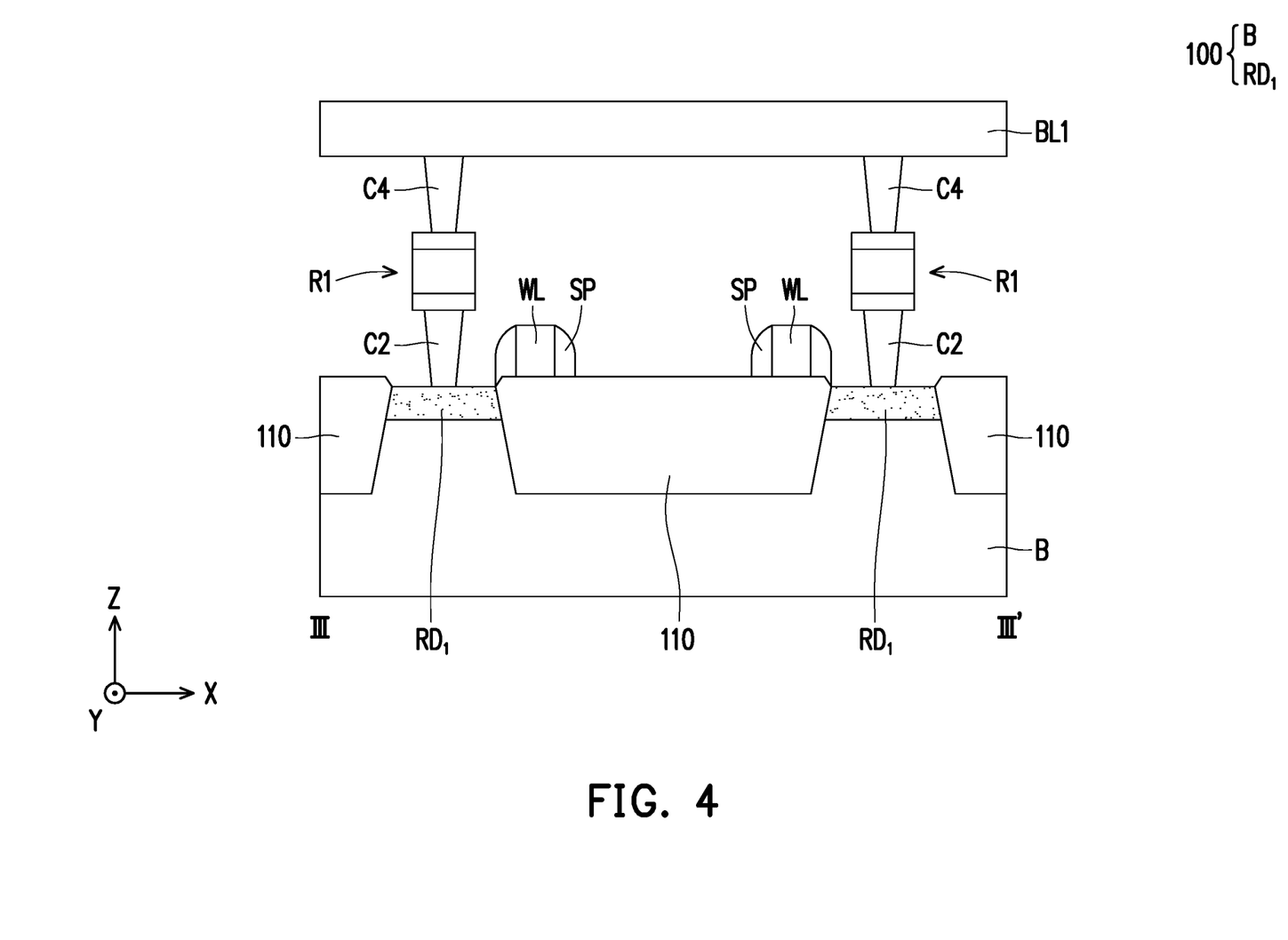
FIG. 4 is a schematic cross-sectional view taken along line III-III' of FIG. 1.
Figure 5:
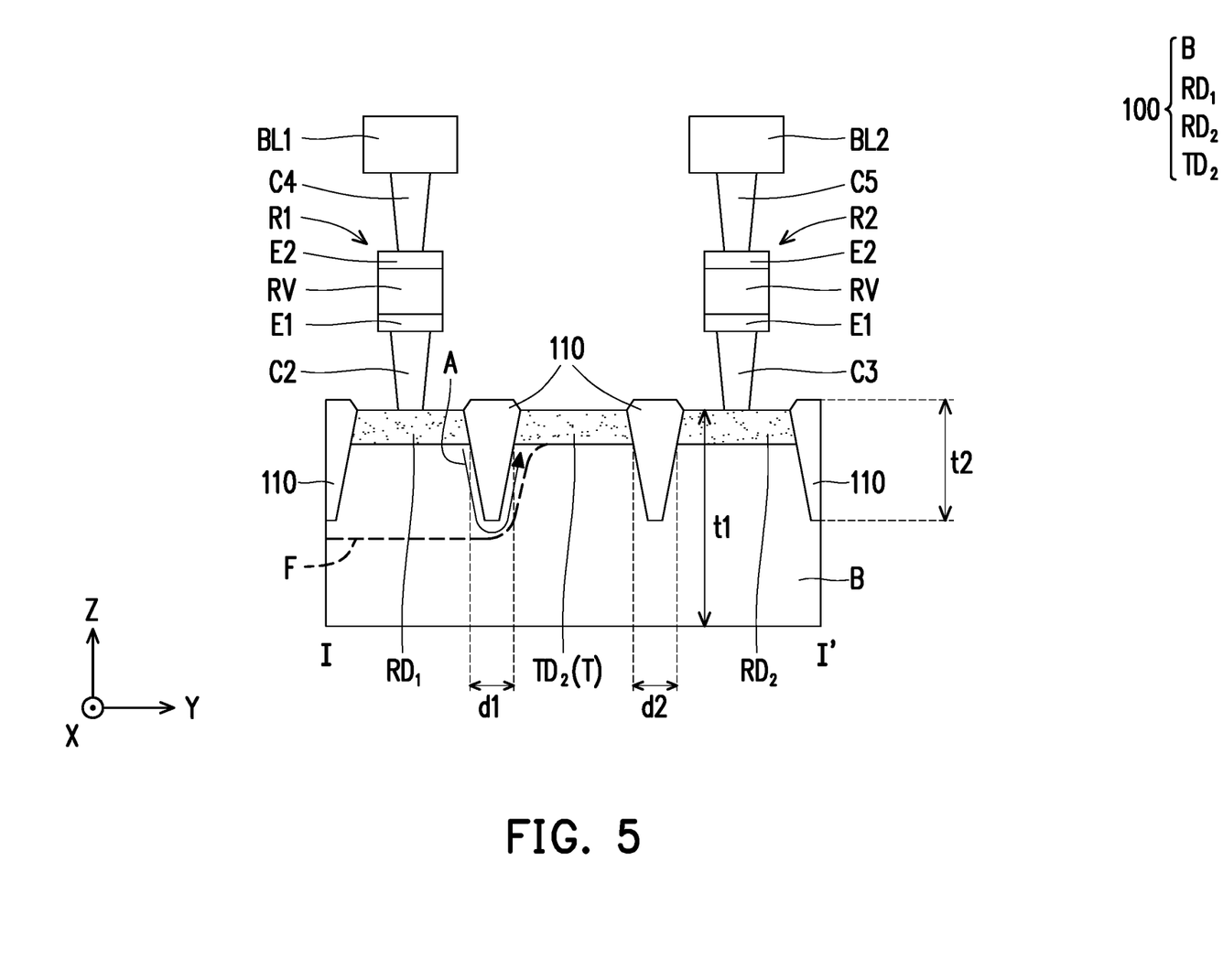
FIG. 5 is a schematic cross-sectional view of a state in which a voltage is applied to part of the memories in the resistive memory device of FIG. 1.

FIG. 1 is a schematic top view of a resistive memory device according to an embodiment of the invention. FIG. 2 is a schematic cross-sectional view taken along line I-I' of FIG. 1. FIG. 3 is a schematic cross-sectional view taken along line II-II' of FIG. 1. FIG. 4 is a schematic cross-sectional view taken along line III-III' of FIG. 1. FIG. 5 is a schematic cross-sectional view of a state in which a voltage is applied to part of the memories in the resistive memory device of FIG. 1. It should be noted that the cross-sectional position of FIG. 5 can refer to the position of the cross-sectional line I-I' in FIG. 1.

Please refer to FIGS. 1 to 4, the resistive memory device 10 includes a substrate 100, an isolation structure 110, at least one word line WL, at least one source line SL, a bit line BL1, a bit line BL2, a resistive memory R1 and a resistive memory R2. In the embodiment, the resistive memory device 10 may further include at least one contact structure C1, at least one contact structure C2, at least one contact structure C3, at least one contact structure C4, and at least one contact structure C5.

In the embodiment, the substrate 100 may include a body region B, at least one doped region $TD_1$, at least one doped region $TD_2$, at least one doped region $RD_1$ and at least one doped region $RD_2$, wherein the at least one doped region $TD_1$, the at least one doped region $TD_2$, the at least one doped region $RD_1$ and the at least one doped region $RD_2$ are disposed on the body region B.

In the embodiment, the conductivity type of the doped region $TD_1$ is different from the conductivity type of the body region B, and the conductivity of the doped region $TD_1$, the doped region $TD_2$, the doped region $RD_1$ and the doped region $RD_2$ are the same as each other. For example, in one embodiment, the body region B may be a P-well, the doped region $TD_1$, the doped region $TD_2$, the doped region $RD_1$ and the doped region $RD_2$ may be N-type doped region (i.e., N+ region). In the embodiment, the doped region $TD_1$, the doped region $TD_2$, the doped region $RD_1$ and the doped region $RD_2$ are spaced apart from each other. In detail, as shown in FIG. 3, in the second direction X, the doped region $TD_1$ and the doped region $TD_2$ are spaced apart from each other by the body region B. In addition, as shown in FIG. 1 and FIG. 2, the doped region $RD_1$, the doped region $TD_2$ and the doped region $RD_2$ are arranged in sequence along the first direction Y and are spaced apart from each other. In other words, in the embodiment, in the first direction Y, the doped region $TD_2$ is located between the doped region $RD_1$ and the doped region $RD_2$. In the embodiment, the second direction X intersects the first direction Y. For example, the second direction X may be substantially perpendicular to the first direction Y.

In the embodiment, the isolation structure 110 is disposed in the substrate 100. In the embodiment, the isolation structure 110 is, for example, a shallow trench isolation (STI) structure. In the embodiment, the material of the isolation structure 110 is, for example, silicon oxide. In the embodiment, as shown in FIGS. 2 to 4, the top surface of the isolation structure 110 is higher than the top surface of the substrate 100. In other embodiments, the top surface of the isolation structure 110 may be substantially coplanar with the top surface of the substrate 100. In the embodiment, as shown in FIG. 1 and FIG. 2, the doped region $TD_2$ and the doped region $RD_1$ are spaced apart from each other by the isolation structure 110, and the doped region $TD_2$ and the doped region $RD_2$ are spaced apart from each other by the isolation structure 110. In the embodiment, as shown in FIG. 1 and FIG. 4, two doped regions $RD_1$ are spaced apart from each other by the isolation structure 110, and two doped regions $RD_2$ are spaced apart from each other by the isolation structure 110. In the embodiment, as shown in FIG. 1, the isolation structure 110 surrounds and covers the sidewalls of the doped region $RD_1$, and the isolation structure 110 surrounds and covers the sidewalls of the doped region $RD_2$.

In the embodiment, as shown in FIG. 1 and FIG. 3, the word lines WL are disposed on the substrate 100, and the doped regions $TD_1$ and $TD_2$ are located at opposite sides of the word line WL. In detail, in the embodiment, a part of the word line WL between the doped region $TD_1$ and the doped region $TD_2$ may serve as the gate of the transistor T, and the doped region $TD_1$ and the doped region $TD_2$ may respectively be used as a terminal for the transistor T. For example, in one embodiment, the doped region $TD_1$ can be used as the source of the transistor T, and the doped region $TD_2$ can be used as the drain of the transistor T. That is to say, the doped region $TD_1$ and the doped region $TD_2$ can be regarded as the doped regions of the transistor T. In the embodiment, only one doped region $TD_1$ is provided between the two word lines WL (i.e., between the two gates of the two transistors T). That is to say, in the second direction X, two adjacent transistors T share the same doped region $TD_1$. For example, in one embodiment, the doped region $TD_1$ can be used as a common source region.

In the embodiment, the material of the word line WL may include a conductor material, such as polysilicon or a metal material. The metal material includes, for example, tungsten (W), aluminum (Al), or copper (Cu). In the embodiment, as shown in FIG. 1, FIG. 3, and FIG. 4, the spacer SP is located on the substrate 100 at opposite sides of the word line WL, and the spacer SP may be a strip structure extending along the first direction Y, which can protect the sidewalls of the word line WL, so that the word line WL is electrically isolated from conductive elements (e.g., the contact structure C1, the contact structure C2, the contact structure C3). In the embodiment, the material of the spacer SP may include silicon oxide ($SiO_2$), silicon nitride ($Si_3N_4$) or other low dielectric materials (low-k). In some embodiments, a gate dielectric layer (not shown) may be provided between the word line WL and the substrate 100 to electrically isolate the gate of the transistor T from the substrate 100.

As described above, the doped region $RD_1$, the doped region $TD_2$ and the doped region $RD_2$ are arranged in sequence along the first direction Y, so that in the embodiment, the doped region $TD_1$ and the doped region $RD_1$ are located at opposite sides of the word line WL, and the doped region $TD_1$ and the doped region $RD_2$ are located at opposite sides of the word line WL.

In the embodiment, the source line SL is disposed on the 100 substrate, and the source line SL is electrically connected with the doped region $TD_1$. In detail, as shown in FIG. 1 and FIG. 3, the source line SL is electrically connected with the doped region $TD_1$ through the at least one contact structure C1. In the embodiment, the material of the contact structure C1 may include a conductor material, such as a metal material or a metal nitride. The metal material includes, for example, tungsten, titanium (Ti), tantalum (Ta), copper (Cu), or aluminum (Al). The metal nitride is, for example, titanium nitride (TiN) or tantalum nitride (TaN). In addition, those skilled in the art should understand that the contact structure C1 penetrates through the dielectric layer (not shown) disposed on the substrate 100 and is electrically connected with the doping region $TD_1$. In addition, the source line SL is omitted in FIG. 2.

As mentioned above, in the second direction X, two adjacent transistors T share the same doped region $TD_1$, whereby the source line SL electrically connected with the doped region $TD_1$ serves as a common source line of two adjacent transistors T in the second direction X.

In the embodiment, the bit line BL1 and the bit line BL2 are disposed on the substrate 100. As shown in FIG. 1, the word lines WL extend along the first direction Y and are arranged along the second direction X, the source line SL extends along the second direction X, and the bit lines BL1 and BL2 along the second direction X extends and are arranged along the first direction Y. In the embodiment, the word line WL intersects the source line SL, the bit line BL1 and the bit line BL2, and the source line SL, the bit line BL1 and the bit line BL2 are arranged parallel to each other. In addition, in the first direction Y, the source line SL is located between the bit line BL1 and the bit line BL2. In the embodiment, the material of the bit line BL1 and the bit line BL2 may include a conductor material, such as a metal material. The metal material includes, for example, tungsten, copper, or aluminum.

In the embodiment, the resistive memory R1 and the resistive memory R2 are disposed on the substrate 100. In the embodiment, the resistive memory R1 and the resistive memory R2 each include a lower electrode E1, an upper electrode E2, and a variable resistance layer RV, the upper electrode E2 is disposed on the lower electrode E1, and the variable resistance layer RV is disposed between the lower electrode E1 and the upper electrode E2.

The materials of the lower electrode E1 and the upper electrode E2 are not particularly limited, any conductive material may be used. For example, the materials of the lower electrode E1 and the upper electrode E2 may respectively be titanium (Ti), tantalum (Ta), titanium nitride (TiN), tantalum nitride (TaN), titanium aluminum nitride (TiAlN), titanium tungsten (TiW) alloy, tungsten, ruthenium (Ru), platinum (Pt), iridium (Ir), graphite or a mixture or a stacked layer structure of the above materials, among which titanium nitride, tantalum nitride, platinum, iridium, graphite or combinations thereof is preferable. The thicknesses of the lower electrode E1 and the upper electrode E2 are also not particularly limited, but usually between 5 nanometers (nm) and 500 nanometers.

The material of the variable resistance layer RV is not particularly limited, and any material which can change its own resistance through applying voltage can be used. In the embodiment, the material of the variable resistance layer RV includes, for example, hafnium oxide ($HfO_2$), tantalum oxide ($Ta_2O_5$), titanium oxide ($TiO_2$), magnesium oxide (MgO), nickel oxide (NiO), niobium oxide ($Nb_2O_5$), aluminium oxide ($Al_2O_3$), vanadium oxide ($V_2O_5$), tungsten oxide ($WO_3$), zinc oxide (ZnO) or cobalt oxide (CoO). In one embodiment, the variable resistance layer RV may be formed by physical vapor deposition or chemical vapor deposition. In another embodiment, considering that the thickness of the variable resistance layer RV generally needs to be limited to a very thin range (for example, 2 nm to 10 nm), it may be formed by atomic layer deposition.

In the embodiment, as shown in FIG. 2 and FIG. 4, in the thickness direction Z of the substrate 100, the resistive memory R1 is located between the substrate 100 and the bit line BL1, and the resistive memory R2 is located between the substrate 100 and the bit line BL2. In the embodiment, the thickness direction Z of the substrate 100 intersects the first direction Y and the second direction X. For example, the thickness direction Z of the substrate 100 may be substantially perpendicular to the first direction Y, and the thickness direction Z of the substrate 100 may be substantially perpendicular to the second direction X.

From another point of view, in the embodiment, the doped region $RD_1$ is electrically connected with the bit line BL1 via the resistive memory R1, and the doped region $RD_2$ is electrically connected with the bit line BL2 via the resistive memory R2. As shown in FIG. 2 and FIG. 4, the doped region $RD_1$ is electrically connected with the bit line BL1 through the at least one contact structure C2, the resistive memory R1 and the at least one contact structure C4 in sequence, and the doped region $RD_2$ is electrically connected with the bit line BL2 via the at least one contact structure C3, the resistive memory R2 and the at least one contact structure C5 in sequence.

In the embodiment, the materials of the contact structure C2, the contact structure C3, the contact structure C4, and the contact structure C5 may respectively include a conductor material, such as a metal material or a metal nitride. The metal material includes, for example, tungsten, copper (Cu), aluminum (Al), titanium (Ti), or tantalum (Ta). The metal nitride is, for example, titanium nitride (TiN), or tantalum nitride (TaN). In one embodiment, the contact structure C2 for connecting the resistive memory R1 and the doped region $RD_1$ and the contact structure C3 for connecting the resistive memory R2 and the doped region $RD_2$ may be formed in the same process step. In one embodiment, the contact structure C4 for connecting the bit line BL1 and the resistive memory R1 and the contact structure C5 for connecting the bit line BL2 and the resistive memory R2 may be formed in the same process step. In addition, those skilled in the art should understand that the contact structure C2, the contact structure C3, the contact structure C4, and the contact structure C5 respectively penetrate through the dielectric layer (not shown) disposed on the substrate 100 and respectively are electrically connected with the doped region $RD_1$, the doped region $RD_2$, the resistive memory R1, the resistive memory R2.

As described above, the doped region $TD_2$ (i.e., the doped region of the transistor T) is spaced apart from the doped region $RD_1$ (electrically connected with the resistive memory R1 and the bit line BL1) via the isolation structure 110, and the doped region $TD_2$ (i.e., the doped region of the transistor T) is spaced apart from the doped region $RD_2$ (electrically connected with the resistive memory R2 and the bit line BL2) via the isolation structure 110. In this way, as shown in FIG. 5, when a voltage application operation is performed on one word line WL (e.g., the word line WL at the right side of FIG. 1) and the bit line BL1, a conductive path (indicated by arrow A) is formed between the selected resistive memory R1 and the doped region $TD_2$ of the transistor T, as a depletion region F across the isolation structure 110 to connect with the doped region $TD_2$ of the transistor T is generated at the interface between the doped region $RD_1$ and the body region B due to the application of a voltage; while a depletion region cannot be generated between the unselected resistive memory R2 and the transistor T because the unselected resistive memory R2 is in the low voltage or floating state without enough applied voltage, so that the circuit state between the unselected resistive memory R2 and the transistor T is in an open state due to the isolation structure 110. That is to say, by spacing apart the doped region $TD_2$ (that is, the doped region of the transistor T) from the doped region $RD_1$ and the doped region $RD_2$ via the isolation structure 110, when a voltage application operation is performed on the resistive memory device 10, the selected one resistive memory of the resistive memories (e.g., the resistive memory R1 in FIG. 5) is electrically connected with the transistor T, while the remaining unselected resistive memory (e.g., the resistive memory R2 in FIG. 5) is electrically insulated from the transistor T. In view of this, during the operation of the resistive memory device 10, the transmission path of the sneak current leakage is cut off, whereby the current of the selected resistive memory can be accurately read to judge the status thereof. In the embodiment, the voltage application operation may include a forming procedure, an initial reset operation, a reset operation, a set operation, a write operation, a read operation, or a combination thereof.

Although the foregoing uses the resistive memory R1 as the selected resistive memory as an example, those skilled in the art can clearly understand from the foregoing descriptions that resistive memory R1 and resistive memory R2 can respectively be electrically connected with the doped region $TD_2$ of the transistor T by applying voltage to the bit line BL1 and the bit line BL2. In this way, in the resistive memory device 10, the transistor T, the resistive memory R1 and the resistive memory R2 constitute a memory cell MC with a structure of a single transistor connected with two memories at the same time (i.e., 1T2R structure). From another point of view, the resistive memory R1 and the resistive memory R2 located at both sides of the transistor T in the first direction Y share the same doped region $TD_2$. For example, in one embodiment, the doped region $TD_2$ can be used as a common drain region.

In the embodiment, in order to effectively cut off the transmission path of the sneak current leakage and accurately read the current of the selected resistive memory, the thickness t1 of the isolation structure 110 in the thickness direction Z of the substrate 100 can be adjusted based on the applied voltage, so that the unselected resistive memory can be electrically insulate from the transistor T via the isolation structure 110, and the depletion region can be generated by the applied voltage across the isolation structure 110 to allow the selected resistive memory to be electrically connected with the transistor T. Similarly, in the embodiment, in order to effectively cut off the transmission path of sneak current leakage the and accurately read the current of the selected resistive memory, the shortest distance d1 of the isolation structure 110 between the doped region $TD_2$ and the doped region $RD_1$ in the first direction Y and the shortest distance d2 of the isolation structure 110 between the doped region $TD_2$ and the doped region $RD_2$ in the first direction Y can be adjusted according to the applied voltage, so that the unselected resistive memory can be electrically insulated from the transistor T, and the selected resistive memory can be electrically connected with the transistor T.

The isolation structure 110 disposed between the doped region $TD_2$ and the doped region $RD_1$, and between the doped region $TD_2$ and the doped region $RD_2$ can be used as a switch to control the transmission path between the resistive memory and the transistor to be turned on or turned off and thereby solve the issue of the sneak current leakages. In other words, a switch for controlling the transmission path between the resistive memory and the transistor to be turned on or turned off and thereby solving the problem of sneak current leakage is built in the resistive memory device 10. In this way, the resistive memory device 10 not only avoids the sneak current leakage with the structure of a single transistor connected with two memories at the same time, but is also compatible with the existing manufacturing process without the need for an additional mask process.

In one embodiment, in the thickness direction Z of the substrate 100, the thickness t1 of the isolation structure 110 may be in a range of about 50 nm to about 500 nm. In addition, in one embodiment, in the first direction Y, the shortest distance d1 between the doped region $TD_2$ and the doped region $RD_1$ may be in a range of about 30 nm to about 300 nm, and the shortest distance d2 between the doped region $TD_2$ and the doped region $RD_2$ may be in a range of about 30 nm to about 300 nm.

In the embodiment, as shown in FIG. 1, in the first direction Y, the length d3 of the doped region $TD_1$ is the same as the length d4 of the doped region $TD_2$.

Figure 6:
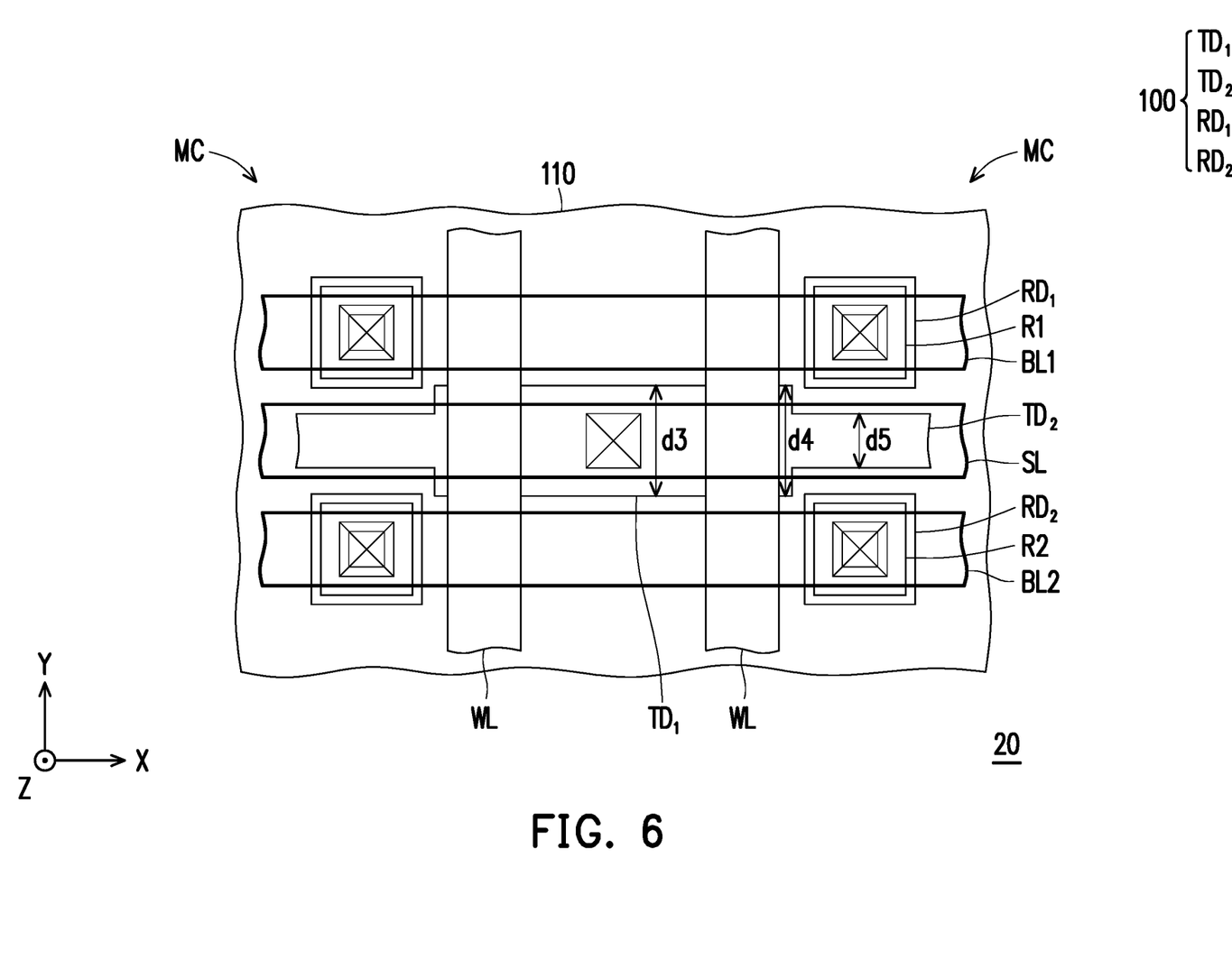
FIG. 6 is a schematic top view of a resistive memory device according to another embodiment of the invention.

FIG. 6 is a schematic top view of a resistive memory device according to another embodiment of the invention. Referring to both FIG. 6 and FIG. 1, the resistive memory device 20 of FIG. 6 is similar to the resistive memory device 10 of FIG. 1, and therefore identical or similar elements are denoted by identical or similar reference numerals, and the description of the same technical contents is omitted.

Referring to FIG. 6, in the resistive memory device 20, in the first direction Y, the doped region $TD_2$ has a length d5 that is less than the length d3 of the doped region $TD_1$. Since the doped region $TD_2$ has a shortened length d5, the distance between the doped region $RD_1$ and the doped region $RD_2$ disposed on both sides of the doped region $TD_2$ in the first direction Y, and the distance between the resistive memory R1 and the resistive memory R2 can be shortened. In this way, when manufacturing the resistive memory device 20, the size of the memory cell MC can be effectively reduced, so that more number of the memory cell MC can be arranged in the given area. In addition, the doped region $TD_2$ is divided into two parts, one part has the length d4, and the other part has the shortened length d5, that is, the doped region $TD_2$ has two different lengths in the first direction Y. However, the present invention is not limited thereof. In other embodiments, the doped region $TD_2$ may only have the shortened length d5 in the first direction Y.

Figure 7:
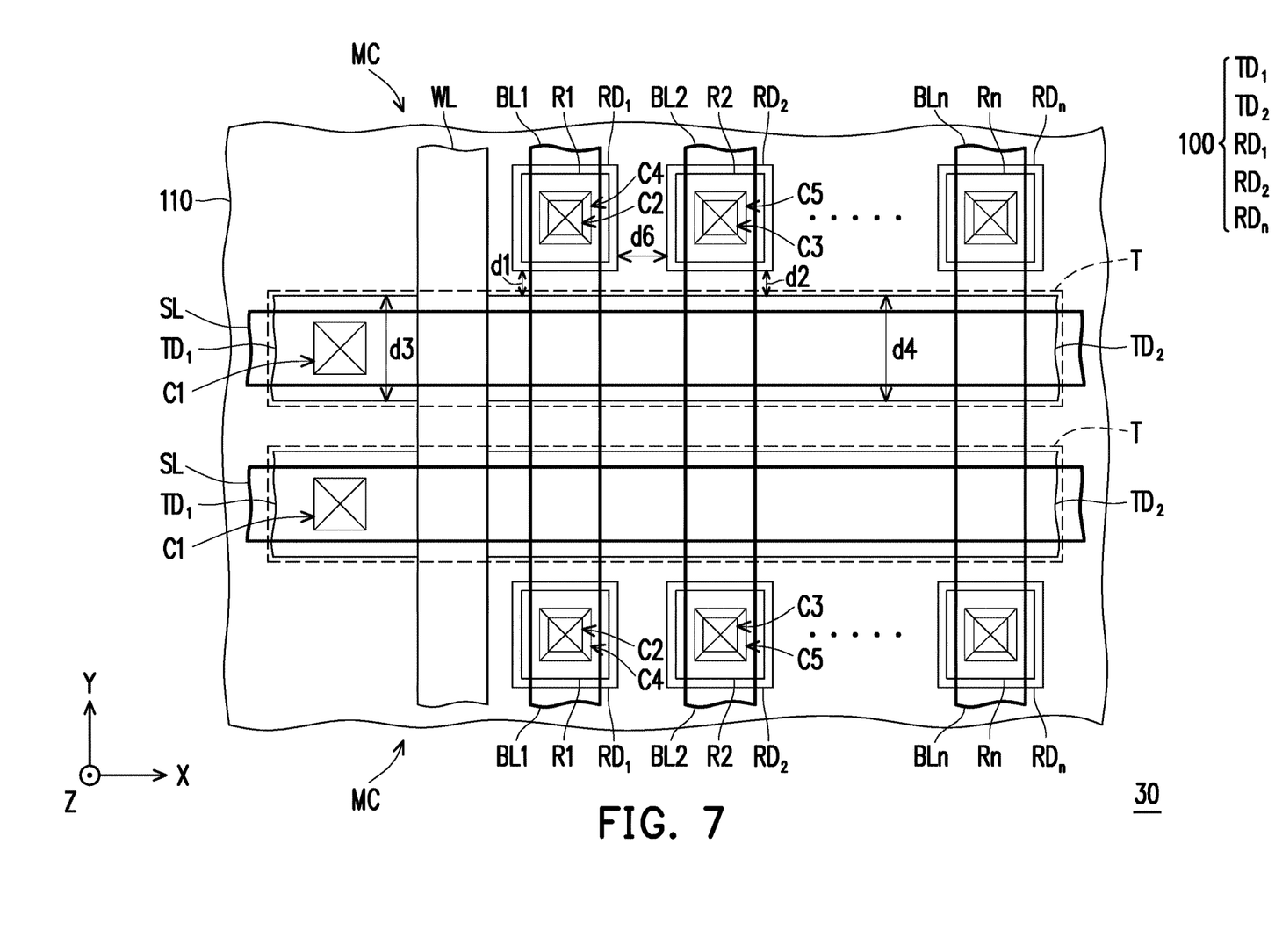
FIG. 7 is a schematic top view of a resistive memory device according to another embodiment of the invention.

FIG. 7 is a schematic top view of a resistive memory device according to another embodiment of the invention. Referring to both FIG. 7 and FIG. 1, the resistive memory device 30 of FIG. 7 is similar to the resistive memory device 10 of FIG. 1, and therefore identical or similar elements are denoted by identical or similar reference numerals, and the description of the same technical contents is omitted.

Referring to FIG. 7, in the resistive memory device 30, each memory cell MC includes a single transistor T and multiple resistive memories R1-Rn. That is to say, the memory cell MC has a structure of a single transistor connected with multiple memories (i.e., 1TnR structure, n is an integer greater than 1). From another point of view, the resistive memories R1-Rn arranged on one side of the transistor T along the second direction X share the same doped region $TD_2$. For example, the doped region $TD_2$ can be used as a common drain region.

In the embodiment, the resistive memory device 30 includes multiple doped regions $RD_1$-$RD_n$ in the substrate 100, and multiple bit lines BL1-BLn on the substrate 100. According to the foregoing descriptions of the doped region $RD_1$, the doped region $RD_2$, the bit line BL1, the bit line BL2, the resistive memory R1 and the resistive memory R2 in conjunction with FIGS. 1-4, those skilled in the art should understand that the resistive memory Rn is electrically connected with the doped region $RD_n$ through at least one contact structure (not marked), and the bit line BLn is electrically connected with the resistive memory Rn through at least one contact structure (not marked). That is to say, the doped region $RD_n$ is electrically connected with the bit line BLn through the resistive memory Rn. In this way, the resistive memories R1-Rn are electrically connected with the doped region $TD_2$ of the transistor T by applying a voltage to the bit lines BL1-BLn, respectively.

In the embodiment, the word line WL and the bit lines BL1-BLn are arranged parallel to each other and extend along the first direction Y, and the word line WL and the bit lines BL1-BLn are arranged along the second direction X. In the embodiment, the source lines SL extend along the second direction X and are arranged along the first direction Y. That is to say, the source line SL intersects the word line WL and the bit lines BL1-BLn. In addition, in the embodiment, the source line SL is located in a film layer different from the bit lines BL1-BLn.

In the embodiment, the shortest distance d6 between the doped region $RD_1$ and the doped region $RD_2$ in the second direction X is designed to be greater than the shortest distance d1 between the doped region $TD_2$ and the doped region $RD_1$ in the first direction Y, and greater than the shortest distance d2 between the doped region $TD_2$ and the doped region $RD_2$ in the first direction Y. That is to say, the shortest distance between any two adjacent doped regions of the doped regions $RD_1$-$RD_n$ in the second direction X is greater than the shortest distance between any one of the doped regions $RD_1$-$RD_n$ and the doped region $TD_2$ of the transistor T in the first direction Y. In this way, when a voltage application operation is performed on the resistive memory device 30, a conductive path can be formed between the selected resistive memory and the doped region $TD_2$ of the transistor T due to the depletion region generated by the applied voltage without forming a conductive path between the selected resistive memory and the adjacent unselected resistive memory to avoid the adjacent resistive memories from affecting each other during operation.

In the embodiment, in the first direction Y, the length d3 of the doped region $TD_1$ is the same as the length d4 of the doped region $TD_2$.

Figure 8:
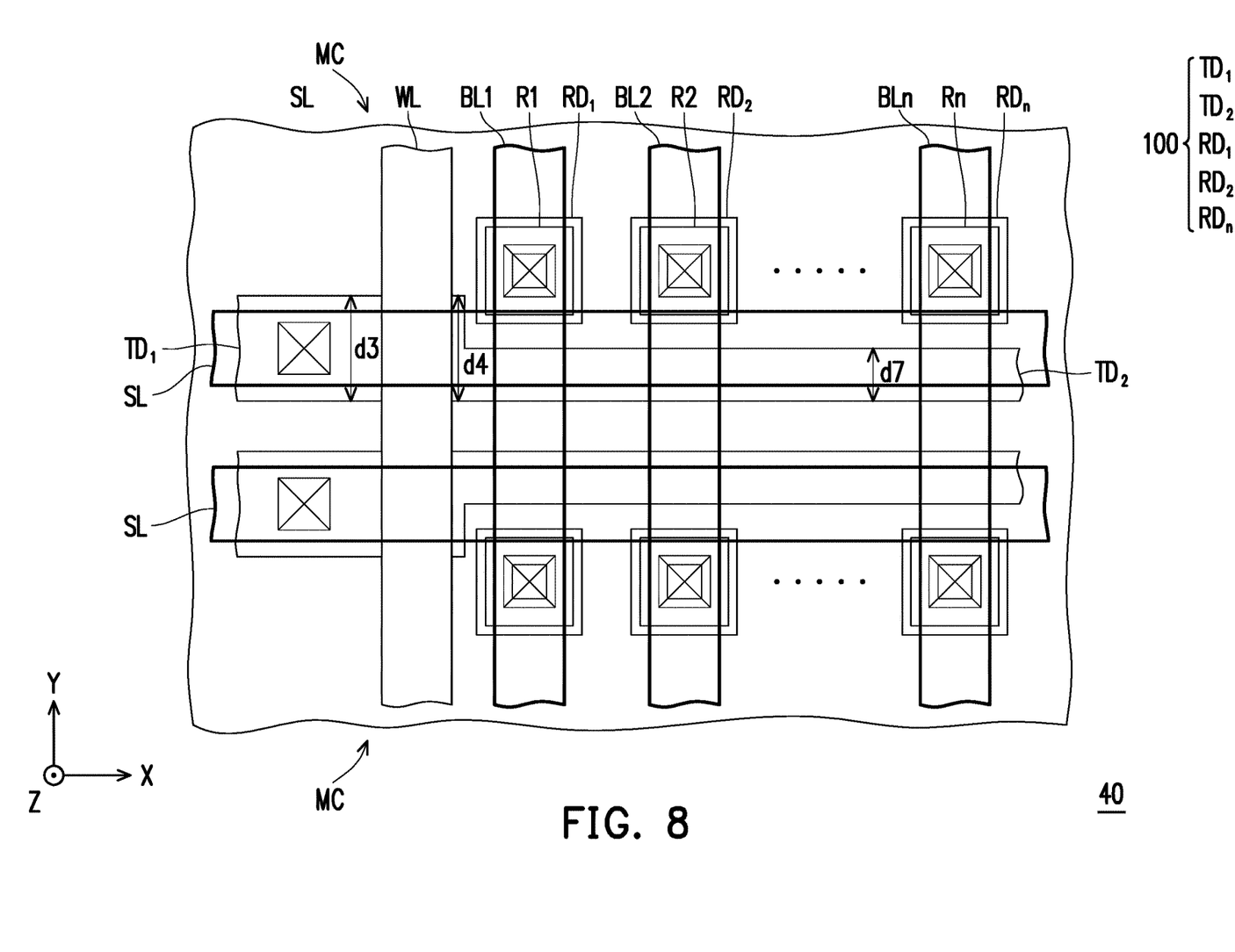
FIG. 8 is a schematic top view of a resistive memory device according to another embodiment of the invention.

FIG. 8 is a schematic top view of a resistive memory device according to another embodiment of the invention. Referring to both FIG. 8 and FIG. 7, the resistive memory device 40 of FIG. 8 is similar to the resistive memory device 30 of FIG. 7, and therefore identical or similar elements are denoted by identical or similar reference numerals, and the description of the same technical contents is omitted.

Referring to FIG. 8, in the resistive memory device 40, in the first direction Y, the doped region $TD_2$ has a length d7 that is less than the length d3 of the doped region $TD_1$. Since the doped region $TD_2$ has a shortened length d7, when manufacturing the resistive memory device 40, the size of the memory cell MC can be effectively reduced, so that more number of the memory cell MC can be arranged in the given area. In addition, the doped region $TD_2$ is divided into two parts, one part has the length d4, and the other part has the shortened length d7, that is, the doped region $TD_2$ has two different lengths in the first direction Y. However, the present invention is not limited thereof. In other embodiments, the doped region $TD_2$ may only have the shortened length d7 in the first direction Y.

Although the present invention has been disclosed as above by way of embodiment, it is not intended to limit the present invention. Any person with ordinary knowledge in the technical field can make some changes and modifications without departing from the spirit and scope of the present invention. Therefore, the scope of protection of the present invention shall be deemed as defined in the appended patent application scope.

What is claimed is:

1. A resistive memory device, comprising:
   a substrate comprising a body region, a first doped region, a second doped region and a third doped region, wherein the first doped region and the second doped region are spaced apart from each other by the body region;
   an isolation structure disposed in the substrate, wherein the second doped region and the third doped region are spaced apart from each other by the isolation structure;
   a word line disposed on the substrate, wherein the first doped region and the second doped region are located at opposite sides of the word line, and the first doped region and the third doped region are located at the opposite sides of the word line;
   a source line disposed on the substrate and electrically connected with the first doped region;
   a first bit line disposed on the substrate; and
   a first resistive memory disposed on the substrate, wherein in a thickness direction of the substrate, the first resistive memory is located between the substrate and the first bit line, and the third doped region is electrically connected with the first bit line via the first resistive memory.

2. The resistive memory device according to claim 1, wherein the substrate further comprising a fourth doped region, wherein the second doped region and the fourth doped region are spaced apart from each other by the isolation structure, and the first doped region and the fourth doped region are located at the opposite sides of the word line.

3. The resistive memory device according to claim 2, further comprising:
   a second bit line disposed on the substrate; and
   a second resistive memory disposed on the substrate, wherein in the thickness direction of the substrate, the second resistive memory is located between the substrate and the second bit line, and the fourth doped region is electrically connected with the second bit line via the second resistive memory.

4. The resistive memory device according to claim 3, wherein the word line extends along a first direction, the source line, the first bit line and the second bit line extend along a second direction, the first direction intersects the second direction, and the thickness direction of the substrate intersects the first direction and the second direction.

5. The resistive memory device according to claim 4, wherein in the first direction, the second doped region is located between the third doped region and the fourth doped region, and the source line is located between the first bit line and the second bit line.

6. The resistive memory device according to claim 4, wherein in the first direction, a shortest distance between the second doped region and the third doped region ranges from 30 nm to 300 nm, and a shortest distance between the second doped region and the fourth doped region ranges from 30 nm to 300 nm.

7. The resistive memory device according to claim 4, wherein in the first direction, a length of the first doped region is the same as a length of the second doped region.

8. The resistive memory device according to claim 4, wherein in the first direction, a length of the first doped region is different from a length of the second doped region.

9. The resistive memory device according to claim 3, wherein the word line, the first bit line and the second bit line are arranged parallel to each other and extend along a first direction, the first bit line and the second bit line are arranged along a second direction, the source line extends along the second direction, the first direction intersects the second direction, and the thickness direction of the substrate intersects the first direction and the second direction.

10. The resistive memory device according to claim 9, wherein in the first direction, a shortest distance between the second doped region and the third doped region ranges from 30 nm to 300 nm, and a shortest distance between the second doped region and the fourth doped region ranges from 30 nm to 300 nm.

11. The resistive memory device according to claim 10, wherein the third doped region and the fourth doped region are arranged along the second direction.

12. The resistive memory device according to claim 11, wherein a shortest distance between the third doped region and the fourth doped region in the second direction is greater than the shortest distance between the second doped region and the third doped region in the first direction, and the shortest distance between the third doped region and the fourth doped region in the second direction is greater than the shortest distance between the second doped region and the fourth doped region in the first direction.

13. The resistive memory device according to claim 9, wherein in the first direction, a length of the first doped region is the same as a length of the second doped region.

14. The resistive memory device according to claim 9, wherein in the first direction, a length of the first doped region is different from a length of the second doped region.

15. The resistive memory device according to claim 3, wherein each of the first resistive memory and the second resistive memory includes:
   a lower electrode
   an upper electrode disposed on the lower electrode; and
   a variable resistance layer disposed between the lower electrode and the upper electrode.

16. The resistive memory device according to claim 1, wherein a thickness of the isolation structure ranges from 50 nm to 500 nm in the thickness direction of the substrate.

* * * * *